United States Patent
Kost

(10) Patent No.: US 6,535,018 B1
(45) Date of Patent: Mar. 18, 2003

(54) VOLTAGE LEVEL SHIFTING CIRCUITS AND METHODS AND SYSTEMS USING THE SAME

(75) Inventor: Michael Allan Kost, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/625,899

(22) Filed: Jul. 26, 2000

(51) Int. Cl.[7] .................. H03K 19/094; H03K 19/075
(52) U.S. Cl. ........................ 326/68; 326/63; 326/80; 326/81; 326/83
(58) Field of Search .................. 326/63, 62, 68, 326/80, 81, 83; 327/333

(56) References Cited

U.S. PATENT DOCUMENTS

| | | | | |
|---|---|---|---|---|
| 4,039,862 A | * | 8/1977 | Dingwall et al. | ............ 327/333 |
| 4,532,436 A | * | 7/1985 | Bismarck | ............... 327/208 |
| 4,980,583 A | * | 12/1990 | Dietz | ...................... 326/68 |
| 5,559,996 A | * | 9/1996 | Fujioka | ................... 395/500 |
| 5,721,879 A | * | 2/1998 | Harada et al. | ............. 395/500 |
| 6,011,421 A | | 1/2000 | Jung | |
| 6,040,710 A | * | 3/2000 | Nakauchi | .................. 326/66 |
| 2001/0013795 A1 | * | 8/2001 | Nojiri | ........................ 326/81 |

FOREIGN PATENT DOCUMENTS

| | | | |
|---|---|---|---|
| EP | 0 661 811 A | | 7/1995 |
| JP | 405343979 A | * | 12/1993 ................. 326/68 |

* cited by examiner

*Primary Examiner*—Thien M. Le
*Assistant Examiner*—Steven S. Paik
(74) *Attorney, Agent, or Firm*—James J. Murphy, Esq.; Winstead Sechrest & Minick, P.C.

(57) ABSTRACT

A level shifter 200 for shifting a logic high voltage of an input signal from a lower voltage to a higher voltage includes a latch 204 for storing a bit of data and having an output for driving a stored logic high bit at the higher voltage. A data node is coupled to a source of the higher voltage and an input of the latch. Voltage control circuitry 203 selectively gates the input signal received at the lower voltage with a bit of data stored in latch 204 and selectively pulls down the voltage at the data node in response.

13 Claims, 3 Drawing Sheets

VOLTAGE LEVEL SHIFTING CIRCUITS AND METHODS AND SYSTEMS USING THE SAME

CROSS-REFERENCE TO RELATED APPLICATION

The following co-pending and co-assigned application contains related information and is hereby incorporated by reference:

Ser. No. 09/591,659, by North, et al., entitled "MATH COPROCESSOR", filed Jun. 9, 2000, currently pending;

Ser. No. 09/590,596, by Haban, entitled "CLOCK GENERATOR CIRCUITRY", filed Jun. 9, 2000, currently pending; and Ser. No. 09/591,124, by Kost et al., entitled "VOLTAGE LEVEL SHIFTER", filed Jun. 9, 2000, currently pending.

BACKGROUND OF THE INVENTION

1. Field of the Invention

The present invention relates in general to integrated circuits and in particular to voltage level shifting circuits, and methods and systems using the same.

2. Description of the Related Art

Sophisticated design and fabrication techniques are rapidly making practical systems-on-a-chip a reality. In turn, a broad range of personal and commercial hand-held appliances can be constructed which embody a high degree of functionality. These appliances include personal digital assistants, personal digital music players, compact computers, point of sale devices, and Internet access devices, to name only a few of the possibilities.

A number of factors must be addressed when designing a system-on-a-chip. Among other things, the device must be capable of interfacing with a broad range of input/output devices which may be required to support various potential user-defined applications. Moreover, the device must be power efficient while operating at high clock speeds. Additionally, this device should have a large address space to flexibly support a range of possible memory configurations and sizes.

SUMMARY OF THE INVENTION

A level shifter is disclosed according to the inventive concepts for shifting a logic high voltage of an input signal from a lower voltage to a higher voltage. The level shifter includes a latch for storing a bit of data and has an output for driving a stored logic high bit at the higher voltage. A data node is coupled to a source of the higher voltage and an input of the latch. Voltage control circuitry selectively gates the input signal received at the lower voltage with a bit of data stored in latch and selectively pulls down the voltage at the data node in response.

Circuits, systems and methods embodying the principles of the present invention have substantial advantages over the prior art. Among other things, level shifting can be performed on any input signal which exceeds the threshold voltage of the selected gating transistors. Moreover, different voltage supplies can be used for driving signals at the higher voltage plane. The implementation of the inventive concepts does not require complex circuitry or complicated switching schemes.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
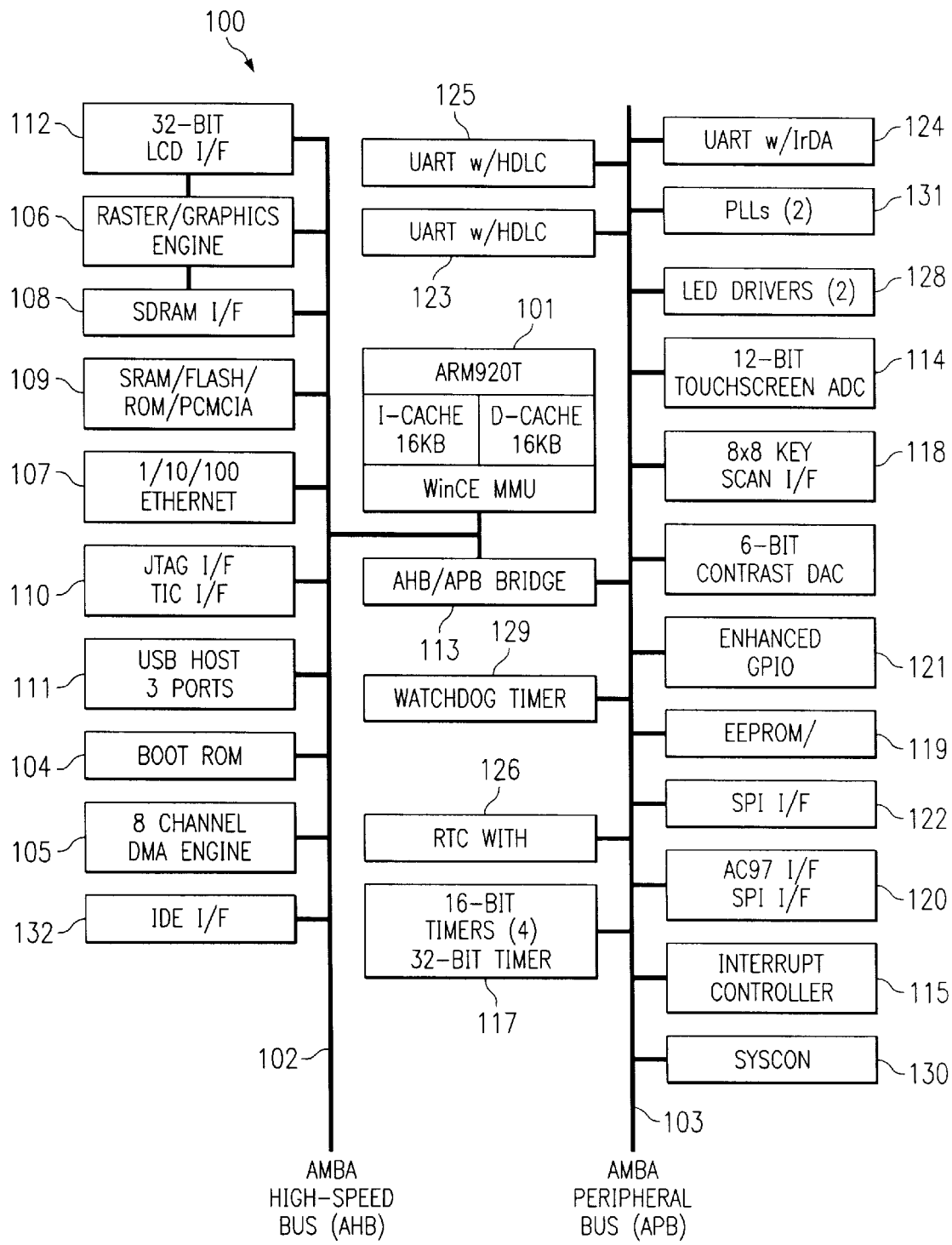
FIG. 1 is a diagram of a microprocessor-based system-on-a-chip embodying the principles of the present invention.
Figure 2:
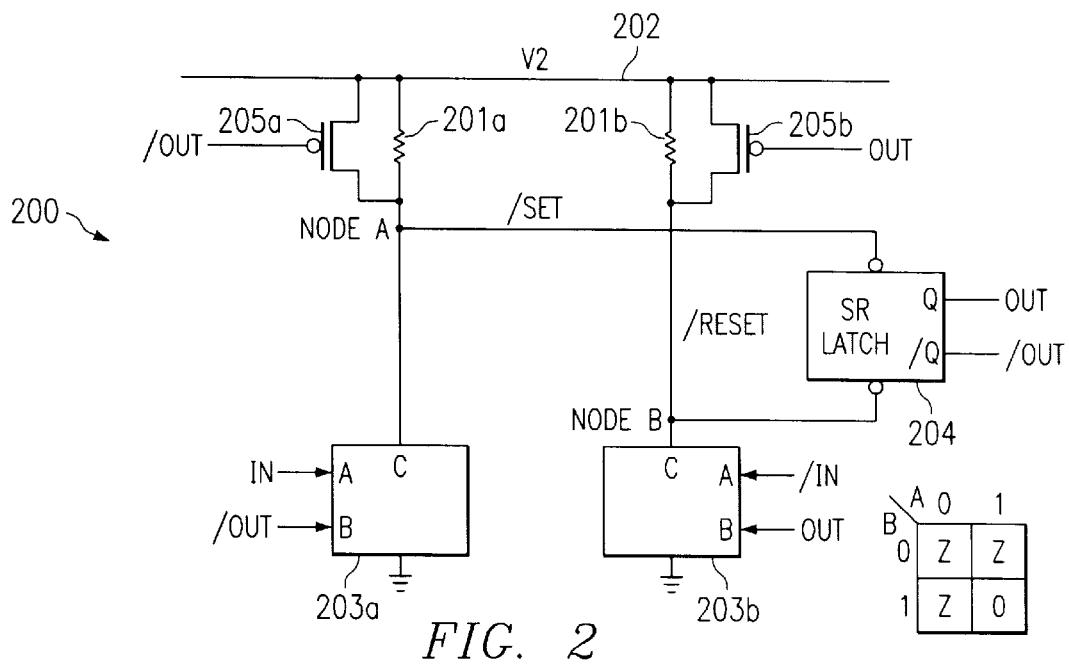
FIG. 2 is a schematic diagram of a voltage level shifter embodying the inventive concepts.

The principles of the present invention and their advantages are best understood by referring to the illustrated embodiment depicted in FIGS. 1–3 of the drawings, in which like numbers designate like parts.

FIG. 1 is a diagram of a microprocessor-based system-on-a-chip 100 embodying the principles of the present invention. System 100 is a general purpose processing device suitable for use in a number of high performance personal and commercial information processing systems requiring small device size and low power consumption. Among other things, system 100 may be embodied in personal portable appliances, such as handheld music players, portable Internet appliances and personal digital assistants, commercial portable appliances such as portable point-of-sale terminals, as well as intelligent peripherals, telecommunications appliances and compact computers.

In the preferred embodiment, system 100 is based on ARM 920T microprocessor core 101 operating in conjunction with a set of on-chip peripheral devices via an AMBA High Speed Bus (AHB or peripheral bus high speed bus) 102 and an AMBA Advanced Peripheral Bus (APB) 103. The peripheral set will be discussed further below. Specific details of microprocessor core 101 are set out in the ARM920T data sheet available from ARM, Ltd., Cambridge, United Kingdom, incorporated herein by reference. Additionally, detailed specifications for AHB 102 and APB 103 are also available from ARM, Ltd., such specifications also incorporated herein by reference.

The functional blocks 104–130 described in detail below, as well as microprocessor core 101, are preferably coupled to buses 102 and 103 using tri-state buffering. Generally, each output (data, address, or control signal) from a given source block (101, 104–130) is coupled to the input of one or more corresponding destination blocks (101, 104–130) by a single conductor 132 through a tri-state buffer. One source block is allowed to drive the given bus 102/103 while the outputs of the remaining source blocks are held in a tri-state or high impedance state.

In the preferred embodiment, the current bus master grants the privilege to a selected source block to drive the bus for a given number of cycles. An idle cycle is inserted at the start of each burst of information to allow for the return of responsive information from the destination (slave) devices from the previous cycle. An idle cycle is also inserted before a new bus master takes control of the bus. During this idle period, addresses and control signals are preferably not driven on the bus, with the exception of the requisite transfer control signals.

The tri-state buffer approach has substantial advantages over other bus interface techniques such as multiplexing and logical gating. Among other things, the tri-state approach requires less logic to implement. Additionally, die area is saved which helps reduce device cost.

System boot ROM 104 operates from high speed bus 101 and controls the selection of the external source of program code from which system 100 operates. In the preferred embodiment, boot ROM 101 comprises 16 KBytes of mask-programmed memory.

A multiple-channel Direct Memory Access (DMA) engine 105 also operates off high speed bus 102. In the illustrated embodiment, DMA engine 105 comprises 8 processing paths corresponding to 8 channels 0–7. Each DMA path way is independently programmable with respect to source and destination addressing. Resource requests are received from the requesting devices, such as the UARTs discussed below via a 16-bit wide Request bus. The various resources connected to resource bus are then associated with a given channel by setting bits in corresponding DMA control registers. Simultaneous memory access requests are resolved by an 8-way arbiter and multiplexer. Additionally, DMA engine 105 includes 4 Linear Feedback Shift registers (LSFRs), for performing CRC error correction.

Block 106 includes both graphics and raster engines. The graphics engine of raster/graphics engine block 106 generally offloads graphics processing tasks from processor core 101, operating off high speed bus 102 as either the bus master or as a register slave. Among other things, graphics engine performs rectangular block fills, Bressingham line drawing and pixel step line drawing. Data transfers are made by graphics engine 106 through bit-block transfers (BitBLTs similar to the DMA transfers discussed above.) The engine portion of raster/graphics engine 106 drives analog CRTs or digital LCDs, including non-interlaced flat panel and dual scanning devices. It can also support an optional interface to an NTSC encoder.

An ethernet MAC 107 is also provided on AMBA bus 102 in the preferred embodiment. Ethernet MAC 107 supports communications with external devices in accordance with the Ethernet/ISO/IEC 8802-3 protocol.

SDRAM interface 108, operating off AHB 102, is preferably based on an ARM PL090 SDRAM controller and a set of associated configuration registers. In the illustrated embodiment, SDRAM interface 108 shares address bus, data bus and DQMn signals with the SRAM controller and PCMCIA interface, arbitrated by external bus interface circuitry under a fixed priority scheme (SDRAM, SRM, PCMCIA and TIC in order from highest to lowest).

The SRAM interface (block 109) is preferably based on an ARM PL090 Static Memory Controller. Block 109 additionally includes a slave-only V2.1 compliant PCMCIA PCCard Interface operating off high speed bus 102.

JTAG/TIC interface 110 supports testing in compliance with IEEE Std. 1149.1—1990, *Standard Test Port* and *Boundary Scan Architecture.*

USB Controller 111 is preferably configured for three root hub ports and includes an integrated transceiver. This embodiment complies with the Open Host Controller Interface Specification for USB, Revision 1.0.

LCD DAC interface 112 provides an analog DC voltage for driving LCD contrast controls, preferably generated from a resistor ladder. The DAC preferably is a 64-step digital to analog converter.

Bridge 113 interfaces high speed bus 102 with the relatively slower AMBA Peripheral Bus (APB) 103. Bridge 113 is a slave on high speed bus 102 and the only master on peripheral bus 103, driving addresses, data and control signals during peripheral accesses.

Analog touch screen interface 114 performs hardware scanning for 4-, 5-, 7-, and 8-wire analog resistive touch screens.

A compatible interrupt controller 115 also operates off of peripheral bus 103 and can handle up to 64 interrupts. Interrupts are defined in software to generate either interrupt requests (IRQs) or fast interrupt requests (FIQs) to processor core 101.

Block 117 includes four 16-bit and two 32-bit interval timers, and a 40-bit time stamp debug timer.

System 100 includes keyboard matrix scan circuitry 118 operating from peripheral bus 103. In the preferred embodiment, a key array of up to 64 keys in 8 rows and 8 columns is supported, with any one or two keys debounced and decoded at one time.

EEPROM/I2C interface 119 supports a connection to an external EEPROM for inputting configuration information on system power-up. Alternatively, this interface can also be used as a generic $I^2C$ Port. EEPROM/I2C block 119 also includes two dedicated ports for Flash ROM programming voltage (FVPP) control, or alternatively, for use as general purpose input/output. Logically, the FVPP block circuitry and the LED block 128 are identical, but reside at different base addresses. LED interface 128 provides a dedicated control for driving 2 LED indicators. The LED pins can also be used as general purpose input/output pins if LEDs are not used.

An AC97/ Inter—IC Sound ($I^2S$) interface 120 is provided on peripheral bus 102 in the preferred embodiment of system 100. A on-chip multiplexer allows the user to select between a connection to an external AC97 codec or an external $I^2S$ bus. In the preferred embodiment, interface 120 supports a dual codec architecture in accordance with the AC97 specification, Revision 2.1. In accordance with the $I^2S$ specification (Philips Semiconductors), the $I^2S$ interface of block 120 supports a digital audio link based on a 3-wire interface which includes a serial clock line, serial data line, and word select line. The preferred $I^2S$ interface includes both a specification compliant transmitter and receiver and can be configured as either the master or slave in the context of the $I^2S$ bus specification.

In addition to the standard GPIO functions, GPIO block 121 in system 100 includes enhanced capability. In particular, interrupts have been added to each of the GPIO pins, along with registers for enabling and masking the interrupts, status and test control registers.

SPI interface (Synchronous Serial Interface) 122 can be used to communicate with an external analog to digital converter and/or digitizer. In the illustrated embodiment two SPI controllers (SPI0 and SPI1) are provided which support the Motorola SPI format, the Texas Instruments SPI format, and the National Semiconductor serial format. The SPI0 Port can be multiplexed with the AC97 pins or with the key matrix row pins.

System 100 includes three of universal asynchronous receive-transmit (UART) interfaces 123–125. These asynchronous ports can be used, for example, to communicate with external RS-232 transceivers generally similar to that of industry standard 16C550 UART devices.

In addition to conventional receive and transmit ports, UART 123 (UART1) can also receive the three modem control signals CTS (Clear to Send), DSR (Data Set Ready), and DCD (Data Carrier Detect). Additionally, UART1 includes an HDLC transmitter which performs framing and bit stuffing in accordance with the HDLC protocol. An HDLC receiver in UART1 performs framing, address matching, code substitution, CRC checking, and optionally, transmission of a CRC sum at end of packet. UART2 (124) additionally includes an IrDA (Infrared Data Association)

SIR protocol processing stage for driving an infrared light emitting diode (LED) and receiving data from a photodiode. UART3 (123) is similar to UART1 except the modem control port is hardwired to a passive state.

Real time clock (RTC) with Trim 126 allows software controlled digital compensation of a 32.768 KHz crystal oscillator. The oscillator can be electronically calibrated by automatic test equipment during manufacture and then adjusted in the field.

Watchdog timer circuitry 129 is based on a 7-bit counter, the most significant bit of which is used to trigger the generation of a Watchdog Reset signal. To keep the reset pulse from occurring, software must "kick the dog" on a periodic basis by resetting the counter and preventing the MSB from activating.

System control block 130 generally controls such central functions as hardware test mode, clock control, power management and system configuration management.

System 100 includes two phase-locked loops (PLLs) 131 which generate the clocks and similar timing signals necessary during device operation. For a more complete description of the preferred clock generation circuitry used in system 100, reference is now made to copending, coassigned patent application Ser. No. 09/590,596, filed Jun. 9, 2000.

IDE interface 132 operates from high speed bus 102 and supports ATAPI compliant connections to both external master and slave IDE devices, up to PIO Mode 4, Multiword DMA Mode 2 (MDMA), and the Ultra DMA (UDMA) mode 3. System 100 connects with an external ATAPI device through a 28-pin port, one or more of these pins shared with the General Purpose I/O port (GPIO).

In the preferred embodiment, all blocks or subsystems 101–132 of system 100 are fabricated on a single integrated circuit chip. This can be accomplished for example using a 0.25 $\mu$m, four layer metal process, although other processes known in the art can also be used. In the illustrated embodiment, processor core 101 operates from a 2.5V nominal supply, although this may be reduced in alternate embodiments. The peripherals in the illustrated embodiment operate from a 3.3V supply. In this embodiment, the nominal clock speed for processor core 101 is 200 MHz.

FIG. 2 is a diagram illustrating the general inventive concepts, as embodied in a level shifter 200. Level shifter 200 can be used in numerous applications where the logic high level of a given signal must be translated from a lower voltage plane to a higher voltage plane. In system 100, for example, voltage shifter 200 could be used to interface circuits, such as the processor core, running from a nominal 2.5V voltage supply and circuits, such as the peripherals, running from a nominal 3.3V voltage supply.

In this example, the input signal IN being upshifted has a logic high voltage V1 driven from a first (lower) voltage supply or rail. A pair of resistors 201a,b, operating from a higher voltage V2 at voltage supply or rail 202, source a corresponding pair of nodes A and B.

Voltage control circuits 203a,b, preferably operating in accordance with the depicted logic table, control the voltages at Nodes A and B. In this case, the complementary signals OUT and /OUT are respectively the Q and /Q, outputs from an SR latch 204 and /IN is the complement of the input signal IN.

SR latch 204 stores the last state of level shifter 200, with the /Set input coming from node A and the /Reset input coming from node B. The /Set and /Reset set signals are controlled by voltage control circuits 203a in accordance with the logic table, where Z represents the high impedance state and the given node remains at a voltage close to the V2 supply voltage and 0 represents the state where current is being sunk and the given node is being pulled down to ground.

In the preferred embodiment, a pair of transistors 205a, 205b disposed in parallel with resistors 201a, 201b pull up nodes A and B to the V2 voltage rail in response to the output singles $OUT_n$ and OUT from latch 204.

Figure 3A:
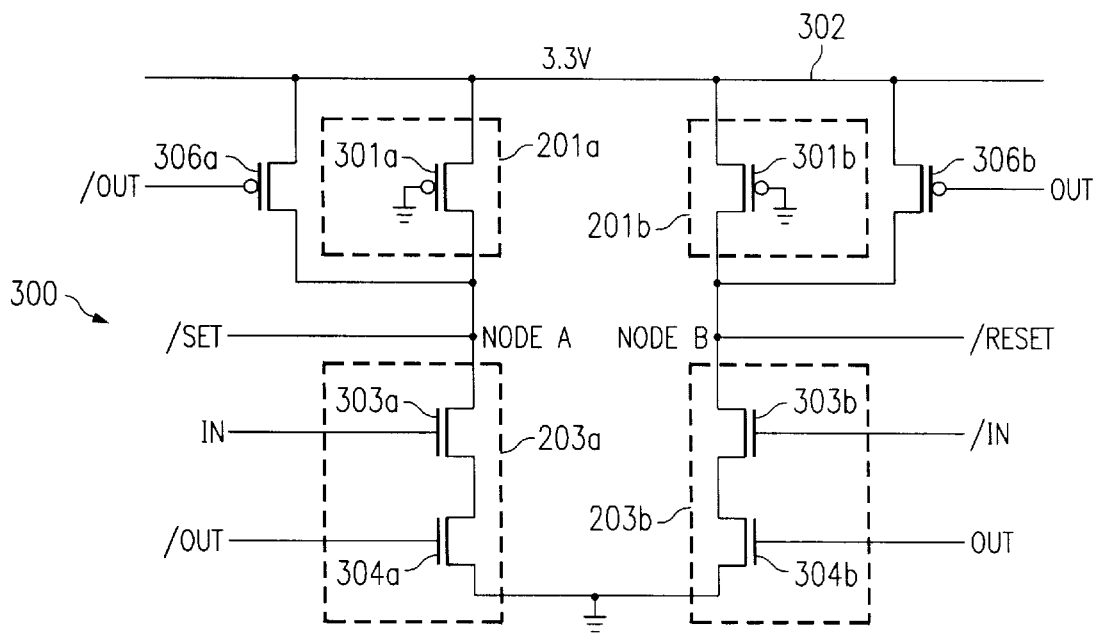
FIGS. 3A–3C are diagrams of a preferred voltage level shifter according to the inventive concepts.

FIG. 3A is an electrical schematic diagram of a preferred level shifter 300 in accordance with the inventive concepts. In this embodiment, a pair of PMOS transistors 301a and 301b, acting as resistors or current sources, couple the corresponding set of output nodes, respectively labeled Node A and Node B, with the high voltage supply rail 302. The gates of transistors of 301a,b are tied to ground. Here, the high voltage supply rail sources 3.3V, and the input signal IN has a 2.5V nominal logic high voltage although the present invention is not limited to 2.5V and 3.3V high voltage levels. The compliment of the input signal /IN is generated from the inverter of FIG. 3C, operating from a 2.5V supply.

A corresponding pair of NMOS transistors 303a, 303b selectively couple Nodes A and B with ground. The voltage at the gate of transistor 303a is controlled by the input signal and the gate of transistor 303b is controlled by the complement of the input signal /IN. In the preferred embodiment, the channel length of PMOS devices 301 is greater or much greater than the channel length of NMOS transistors 303. In this embodiment, gates (control circuits) 203aa, 203b are formed with a second pair of NMOS transistors 304a, 304b, whose gates are respectively controlled by the complementary output signals /OUT and OUT.

Figure 3B:
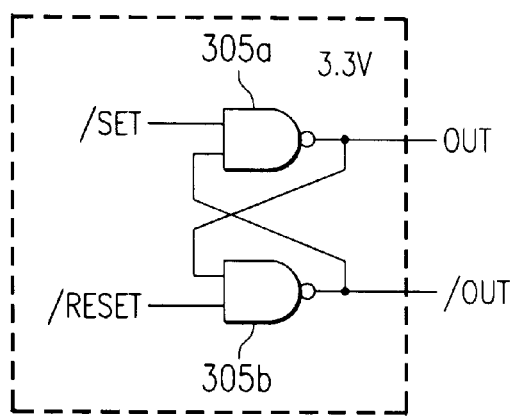
Figure 3C:
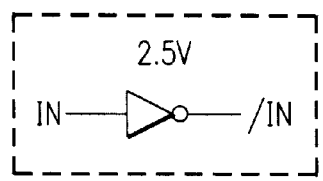

The signals /OUT and OUT in this embodiment are generated at the outputs of the latch shown in FIG. 3B. Specifically, a pair of cross-coupled NAND gates 305a,b latch the last state of the signals /SET and /RESET appearing at Nodes A and B of FIG. 3A. In this embodiment, NAND gates 305a and 305b drive the complementary outputs OUT and /OUT from the 3.3 V voltage supply rail.

A pair of PMOS transistors 306a and 306b, having gate voltages controlled by /OUT and OUT respectively, are disposed in parallel with PMOS transistors 301a,b.

The operation of level shifter 300 can be described with reference to the partial timing diagram of FIG. 4. For purposes of discussion, it will be assumed that at the beginning of the cycle latched states of OUT and /OUT are respectively a logic low and a logic high.

An active high signal IN of approximately 2.5V is presented at the gate transistor 303a and a logic low is presented at the gate of transistor 304a. As a result, Node A is pulled down to ground. /SET consequently transitions to a logic low state. At the same time, the complementary states of /IN and OUT insure that transistors 303b and 304b are turned-off, such that NODE B remains at a voltage close to the 3.3V supply rail (i.e. /RESET is logic high).

With /SET low and /RESET high, the output OUT from NAND gate 305a latches to a 3.3V logic high state and the output /OUT from NAND gate 305b to a logic low state. In other words, the original 2.5 V logic high level of IN has now been translated to the 3.3 V logic high level at output OUT.

When OUT transitions to a logic high and /OUT transitions to a logic low, transistors 306a and 306b respectively turn on and turn off. Additionally, transistor 304a turns off.

Consequently, Node A (/SET) is pulled back up to the 3.3V rail. /RESET remains high.

Figure 4:
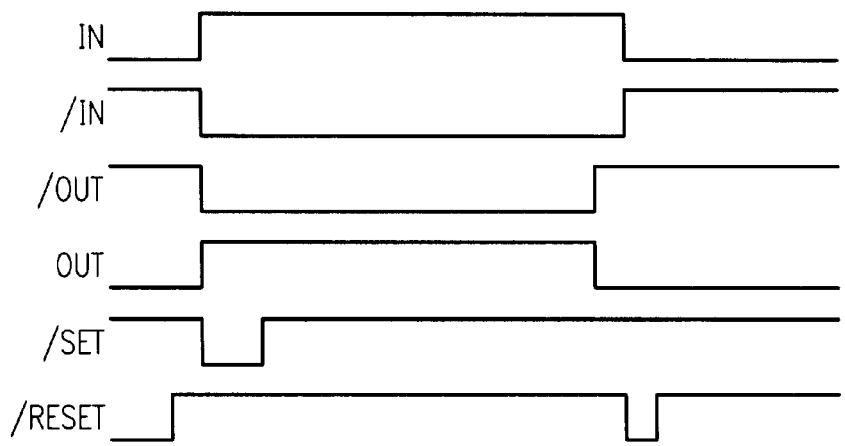
FIG. 4 is a timing diagram illustrating the operation of the voltage level shifter shown in FIGS. 2A–2C.

Next, consider the case where IN transitions low and /IN transitions high, as shown in FIG. 4. With OUT already in the logic high state, transistors 303b and 304b turn on, puling down NODE B (/RESET). Transistors 303a and 304a turn off and /SET is pulled to the 3.3 V. rail.

With /SET high and /RESET low, the outputs OUT and /OUT of latch 204 transition to a logic low and logic high state respectively. Thereafter, pull up transistor 306b turns on pulling /RESET back to a logic high state.

As indicated above, the 2.5V and 3.3V logic high voltage planes are exemplary only. Generally, level shifter 300 can be used for any input signal IN or /IN with a logic high voltage above the threshold voltage $V_t$ of NMOS transistors 303a,b.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A level shifter for shifting a logic high voltage of an input signal from a lower voltage to a higher voltage comprising:
   a latch for storing a bit of data and having an output for driving a stored logic high bit at the higher voltage;
   a data node coupled to a source of the higher voltage by a current source and an input of the latch; and
   voltage control circuitry for selectively gating the input signal received at the lower voltage with a bit of data stored in the latch and selectively pulling down a voltage at the data node in response comprising:
      a first transistor having a current path coupled to the data node and having a gate terminal receiving the input signal; and
      a second transistor having a current path in series with the first transistor and ground and a gate terminal coupled to an output of the latch, the first and second transistors selectively coupling the data node to ground.

2. The level shifter of claim 1 wherein the latch comprises a Set—Reset latch and the input of the latch comprises a Set input.

3. The level shifter of claim 1 wherein the lower voltage is selected to be greater than a threshold voltage of the first transistor.

4. The level shifter of claim 1 wherein the lower voltage level is nominally 2.5V and the higher voltage level is nominally 3.3V.

5. A level shifter comprising:
   a latch including a set input and a reset input and first and second complementary outputs driving data having a voltage swing between a first high voltage and a low voltage;
   a first gate for selectively gating an input signal with a voltage swing between a second high voltage and said low voltage with a signal output from said first output of said latch to drive said set input of said latch comprising:
      a node coupled to said set input of said latch;
      a first transistor of a first type for pulling up said node to said first high voltage in response to said signal output from said first one of said outputs of said latch;
      a second transistor of a second type coupled in series with said node and having a control terminal receiving said input signal; and
      a third transistor of said second type coupled in series between said second transistor and said low voltage and having a control terminal coupled to said first one of said outputs of said latch; and
   a second gate for selectively gating a complement of said input signal with a signal output from said second one of said outputs of said latch to drive said reset input of said latch comprising:
      a node coupled to said reset input of said latch;
      a first transistor of a first type for pulling up said node to said first high voltage in response to said signal output from said second one of said outputs of said latch;
      a second transistor of second type coupled in series with said node and having a control terminal receiving said complement of said input signal; and
      a third transistor of said second type coupled in series between said second transistor and said low voltage and having a control terminal coupled to said second one of said outputs of said latch.

6. The level shifter of claim 5 wherein said first transistor comprises a PMOS field effect transistor and said second transistor comprises an NMOS field effect transistor.

7. The level shifter of claim 5 wherein said first high voltage is higher than said second high voltage.

8. The level shifter of claim 7 wherein said first high voltage is nominally 3.3V and said second voltage is nominally 2.5V.

9. A system comprising:
   first circuitry operating from a first supply voltage;
   second circuitry operating from a second supply voltage; and
   a level shifter for shifting a voltage level of a signal being transmitted from said first circuitry to said second circuitry comprising:
      a latch for storing a bit of data and having an output for driving a stored logic high bit at the second supply voltage;
      a data node doupled to the second supply voltage and an input of the latch; and
      a gate for selectively pulling down the voltage at said node in response to a state of said signal being transmitted and a state of a bit of data stored in said latch comprising:
         a first transistor having a current path coupled to the said node and a gate terminal receiving the input signal; and
         a second transistor having a current path coupled in series with the first transistor and ground and a gate terminal coupled to an output of the latch, the first and second transistors selectively coupling the data node to ground.

10. The system of claim 9 wherein said first circuitry and said second circuitry are disposed on a single integrated circuit chip.

11. The system of claim 9 wherein said first supply voltage is nominally 2.5V and said second supply voltage is nominally 3.3V.

12. The system of claim 9 wherein said level shifter further comprises:
   a second data node coupled to the second supply voltage and a second input of the latch; and
   a second gate for selectively pulling down the voltage at said second node in response to a state of a complement of said signal being transmitted and said bit of data stored in said latch.

13. A method for translating a signal from a lower voltage to a higher voltage comprising the steps of:
   storing a bit of data in a latch, the latch driving a logic high output at the higher voltage;
   gating the signal at the lower voltage with the bit of data stored in the latch to generate a control signal said step of gating comprising the substep of:
      selectively coupling an input of the latch to ground through a first transistor having a gate terminal coupled to receive the signal and a second transistor in series with the first transistor and having a gate terminal coupled an output of the latch; and
   selectively changing a state of the output of the latch in response to the control signal.

* * * * *